US012772741B2

(12) United States Patent
Tamada

(10) Patent No.: US 12,772,741 B2
(45) Date of Patent: Oct. 20, 2026

(54) PIEZOELECTRIC FILM

(71) Applicant: FUJIFILM Corporation, Tokyo (JP)

(72) Inventor: Yoshinori Tamada, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 531 days.

(21) Appl. No.: 18/545,049

(22) Filed: Dec. 19, 2023

(65) Prior Publication Data

US 2024/0122074 A1 Apr. 11, 2024

Related U.S. Application Data

(63) Continuation of application No. PCT/JP2022/024811, filed on Jun. 22, 2022.

(30) Foreign Application Priority Data

Jul. 12, 2021 (JP) ................................ 2021-114862

(51) Int. Cl.
*H10N 30/857* (2023.01)
*H10N 30/00* (2023.01)

(52) U.S. Cl.
CPC ......... *H10N 30/857* (2023.02); *H10N 30/704* (2024.05)

(58) Field of Classification Search
CPC .. H10N 30/857; H10N 30/704; H10N 30/852; H04R 17/00
See application file for complete search history.

(56) References Cited

U.S. PATENT DOCUMENTS 8,663,493 B2 * 3/2014 Matsuda ................ H10N 30/05 427/547
9,293,688 B2 * 3/2016 Suenaga .................. H01G 5/18
(Continued)

FOREIGN PATENT DOCUMENTS

CN 1830098 A 9/2006
CN 102029789 A 4/2011
(Continued)

OTHER PUBLICATIONS

Chinese Office Action for corresponding Chinese Application No. 202280048717.6, dated Jun. 18, 2026, with English translation.
(Continued)

*Primary Examiner* — Pedro J Cuevas
(74) *Attorney, Agent, or Firm* — Birch, Stewart, Kolasch & Birch, LLP

(57) ABSTRACT

Provided is a piezoelectric film which is capable of suppressing a decrease in acoustic characteristics associated with use of a long period of time and has high durability. The piezoelectric film includes a piezoelectric layer consisting of a polymer-based piezoelectric composite material which contains piezoelectric particles in a matrix containing a polymer material and electrode layers formed on both surfaces of the piezoelectric layer, in which, in a case where a smaller value of a domain ratio X between a c domain and an a domain, which is measured by an X-ray diffraction method from one main surface side of the piezoelectric layer, or a domain ratio Y between a c domain and an a domain, which is measured by an X-ray diffraction method from the other main surface side of the piezoelectric layer, is set to 1.00, the other domain ratio is 1.05 or more.

2 Claims, 4 Drawing Sheets

(56) References Cited

U.S. PATENT DOCUMENTS

| | | | | |
|---|---|---|---|---|
| 9,496,847 | B2 * | 11/2016 | Ballandras | H03H 9/178 |
| 9,987,843 | B2 * | 6/2018 | Mizukami | B41J 2/1628 |
| 10,091,586 | B2 * | 10/2018 | Ozawa | H10N 30/883 |
| 10,147,868 | B2 * | 12/2018 | Ozawa | H10N 30/092 |
| 11,140,500 | B2 * | 10/2021 | Murakami | G10H 3/14 |
| 11,489,462 | B2 * | 11/2022 | Oshima | H10N 30/8542 |
| 11,509,244 | B2 * | 11/2022 | Matsuda | H02N 2/163 |
| 11,540,074 | B2 * | 12/2022 | Murakami | H04R 17/005 |
| 11,930,714 | B2 * | 3/2024 | Tamada | H10N 30/852 |
| 11,937,510 | B2 * | 3/2024 | Harada | H10N 30/50 |
| 12,069,429 | B2 * | 8/2024 | Fujikata | H04R 17/005 |
| 12,075,211 | B2 * | 8/2024 | Ashikawa | H04R 17/00 |
| 12,375,859 | B2 * | 7/2025 | Kikuchi | H04R 1/46 |
| 12,376,495 | B2 * | 7/2025 | Haga | H10N 30/852 |
| 12,382,225 | B2 * | 8/2025 | Ishida | H10N 30/04 |
| 12,568,766 | B2 * | 3/2026 | Haga | H04R 17/005 |
| 2009/0324954 | A1 * | 12/2009 | Nakajima | H10N 30/097 423/598 |
| 2010/0066211 | A1 | 3/2010 | Ono et al. | |
| 2011/0074890 | A1 | 3/2011 | Miyazawa et al. | |
| 2011/0289744 | A1 | 12/2011 | Ohnishi et al. | |
| 2011/0297870 | A1 * | 12/2011 | Matsuda | H10N 30/097 252/62.9 R |
| 2013/0076204 | A1 * | 3/2013 | Matsuda | B08B 7/026 252/62.9 R |
| 2013/0088120 | A1 * | 4/2013 | Hayashi | B08B 7/026 252/62.9 R |
| 2013/0187516 | A1 * | 7/2013 | Suenaga | H01G 5/18 310/360 |
| 2014/0125204 | A1 * | 5/2014 | Matsuda | H10N 30/8536 310/365 |
| 2014/0210309 | A1 * | 7/2014 | Miyoshi | G10H 3/146 310/313 A |
| 2014/0292155 | A1 * | 10/2014 | Ballandras | H03H 9/178 29/25.35 |
| 2015/0214469 | A1 | 7/2015 | Hayashi et al. | |
| 2016/0014526 | A1 | 1/2016 | Miyoshi et al. | |
| 2016/0020380 | A1 * | 1/2016 | Miyoshi | C08L 101/00 252/62.9 PZ |
| 2016/0351788 | A1 | 12/2016 | Mizukami | |
| 2017/0334205 | A1 * | 11/2017 | Mizukami | B41J 2/1642 |
| 2017/0373243 | A1 * | 12/2017 | Ozawa | H10N 30/87 |
| 2018/0160248 | A1 | 6/2018 | Murakami et al. | |
| 2021/0119108 | A1 * | 4/2021 | Harada | H10N 30/50 |
| 2021/0392453 | A1 * | 12/2021 | Murakami | H04R 31/003 |
| 2022/0102619 | A1 * | 3/2022 | Kikuchi | C08F 20/34 |
| 2022/0103949 | A1 * | 3/2022 | Ishida | H10N 30/883 |
| 2022/0109096 | A1 | 4/2022 | Tamada | |
| 2022/0115580 | A1 * | 4/2022 | Tamura | G06F 1/1652 |
| 2022/0115582 | A1 * | 4/2022 | Tsuruoka | H10N 30/872 |
| 2022/0116714 | A1 * | 4/2022 | Haga | H04R 17/005 |
| 2022/0329950 | A1 * | 10/2022 | Fujikata | H04R 17/005 |
| 2022/0344573 | A1 * | 10/2022 | Haga | H04R 17/005 |
| 2023/0363284 | A1 * | 11/2023 | Kagawa | H10N 30/852 |
| 2023/0421964 | A1 * | 12/2023 | Tamada | H10N 30/50 |
| 2024/0163615 | A1 * | 5/2024 | Takekuma | H04R 17/005 |
| 2024/0260476 | A1 * | 8/2024 | Miyoshi | H10N 30/88 |
| 2025/0194427 | A1 * | 6/2025 | Tamada | H10N 30/852 |

FOREIGN PATENT DOCUMENTS

| | | | | | |
|---|---|---|---|---|---|
| CN | 102906891 | A | | 1/2013 | |
| CN | 104803676 | A | | 7/2015 | |
| CN | 117813842 | A | * | 4/2024 | H04R 17/00 |
| CN | 118044227 | A | * | 5/2024 | H04R 17/00 |
| EP | 3993442 | A1 | * | 5/2022 | H10N 30/883 |
| EP | 3993443 | A1 | * | 5/2022 | H04R 17/005 |
| EP | 4080908 | A1 | * | 10/2022 | H04R 17/005 |
| EP | 4149119 | A1 | * | 3/2023 | H10N 30/883 |
| EP | 4277299 | A1 | * | 11/2023 | H10N 30/87 |
| EP | 3993442 | B1 | * | 7/2024 | H10N 30/883 |
| JP | 2010-161286 | A | | 7/2010 | |
| JP | 2014-212307 | A | | 11/2014 | |
| JP | 2016-225409 | A | | 12/2016 | |
| TW | 202042570 | A | * | 11/2020 | H04R 17/005 |
| TW | 202103501 | A | * | 1/2021 | H10N 30/883 |
| WO | WO 2017/018313 | A1 | | 2/2017 | |
| WO | WO 2018/216225 | A1 | | 11/2018 | |
| WO | WO 2020/261877 | A1 | | 12/2020 | |

OTHER PUBLICATIONS

Chinese Office Action and Search Report for corresponding Chinese Application No. 202280048717.6, dated Apr. 2, 2026, with English translation.

International Preliminary Report on Patentability and Written Opinion of the International Searching Authority for International Application No. PCT/JP2022/024811, dated Jan. 25, 2024, with an English translation.

International Search Report for International Application No. PCT/JP2022/024811, dated Aug. 2, 2022, with an English translation.

* cited by examiner

PIEZOELECTRIC FILM

CROSS-REFERENCE TO RELATED APPLICATIONS

This application is a Continuation of PCT International Application No. PCT/JP2022/024811 filed on Jun. 22, 2022, which claims priority under 35 U.S.C. § 119(a) to Japanese Patent Application No. 2021-114862 filed on Jul. 12, 2021. The above applications are hereby expressly incorporated by reference, in their entirety, into the present application.

BACKGROUND OF THE INVENTION

1. Field of the Invention

The present invention relates to a piezoelectric film.

2. Description of the Related Art

With reduction in thickness and weight of displays such as liquid crystal displays and organic electro luminescence (EL) displays, speakers used in these thin displays are also required to be thinner and lighter. In addition, with the development of flexible displays including flexible substrates such as plastics, speakers used in the flexible displays are also required to be flexible.

Therefore, as a speaker which is thin and can be integrated into a thin display or a flexible display without impairing lightness and flexibility, a sheet-like piezoelectric film having flexibility and a property of stretching and contracting in response to an applied voltage has been suggested.

For example, a piezoelectric film (electroacoustic conversion film) disclosed in JP2014-212307A has been suggested as a sheet-like piezoelectric film which has flexibility and can stably reproduce a high-quality sound.

The piezoelectric film disclosed in JP2014-212307A includes a polymer-based piezoelectric composite material obtained by dispersing piezoelectric particles in a viscoelastic matrix consisting of a polymer material having viscoelasticity at normal temperature, and electrode layers provided to sandwich the polymer-based piezoelectric composite material. The piezoelectric film disclosed in JP2014-212307A includes a protective layer formed on a surface of a thin film electrode as a preferred aspect.

SUMMARY OF THE INVENTION

In a case where a voltage is applied to such a piezoelectric film, the piezoelectric layer of the piezoelectric film stretches and contracts greatly in an in-plane direction. In a case where the piezoelectric film is used as a speaker, by fixing end parts of the piezoelectric film to a support member, the stretch and contraction of the piezoelectric layer in the in-plane direction is converted into vibration in a thickness direction and a sound is generated.

Based on the study conducted by the present inventors, since the end parts of the piezoelectric film are fixed to the support member, the piezoelectric layer in the piezoelectric film is greatly warped. The occurrence of warping means that a degree of stretching and contracting of the piezoelectric layer varies in the thickness direction, and this applies a large stress to the piezoelectric layer itself, causing defects such as cracks and peeling inside the piezoelectric layer. Therefore, there is a problem that acoustic characteristics deteriorate with the use of a long period of time.

An object of the present invention is to solve such a problem of the related art, and is to provide a piezoelectric film which is capable of suppressing a decrease in acoustic characteristics associated with use of a long period of time and has high durability.

In order to achieve the above-described object, the present invention has the following configurations.

[1] A piezoelectric film comprising:

a piezoelectric layer consisting of a polymer-based piezoelectric composite material which contains piezoelectric particles in a matrix containing a polymer material; and electrode layers formed on both surfaces of the piezoelectric layer, in which, in a case where a smaller value of a domain ratio X between a c domain and an a domain, which is measured by an X-ray diffraction method from one main surface side of the piezoelectric layer, or a domain ratio Y between a c domain and an a domain, which is measured by an X-ray diffraction method from the other main surface side of the piezoelectric layer, is set to 1.00, the other domain ratio is 1.05 or more.

[2] The piezoelectric film according to [1], in which an average value of the domain ratio X and the domain ratio Y is 2 or more.

According to the present invention, it is possible to provide a piezoelectric film which is capable of suppressing a decrease in acoustic characteristics associated with use of a long period of time and has high durability.

DESCRIPTION OF THE PREFERRED EMBODIMENTS

Hereinafter, the piezoelectric film according to the embodiment of the present invention will be described in detail based on suitable embodiments shown in the accompanying drawings.

Although configuration requirements to be described below are described based on representative embodiments of the present invention, the present invention is not limited to the embodiments.

Any numerical range expressed using "to" in the present specification refers to a range including the numerical values before and after the "to" as a lower limit value and an upper limit value, respectively.

Piezoelectric Film

The piezoelectric film according to the embodiment of the present invention is a piezoelectric film including a piezoelectric layer consisting of a polymer-based piezoelectric composite material which contains piezoelectric particles in a matrix containing a polymer material, and electrode layers formed on both surfaces of the piezoelectric layer, in which, in a case where a smaller value of a domain ratio X between a c domain and an a domain, which is measured by an X-ray diffraction method from one main surface side of the piezoelectric layer, or a domain ratio Y between a c domain and an a domain, which is measured by an X-ray diffraction method from the other main surface side of the piezoelectric layer, is set to 1.00, the other domain ratio is 1.05 or more.

Figure 1:
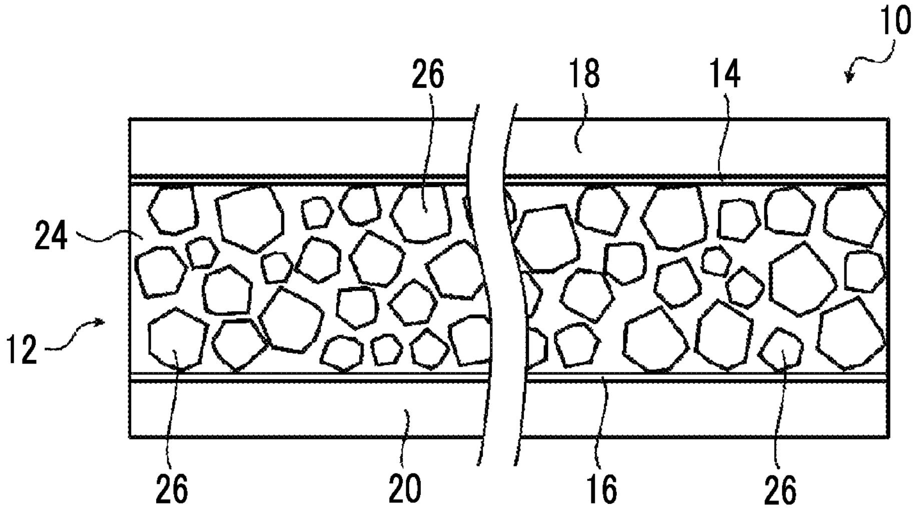
FIG. 1 is a view conceptually showing an example of a piezoelectric film according to the embodiment of the present invention.

FIG. 1 conceptually shows an example of the piezoelectric film according to the embodiment of the present invention.

A piezoelectric film 10 shown in FIG. 1 includes a piezoelectric layer 12 which is a sheet-like material having piezoelectric characteristics, a first electrode layer 16 which is laminated on one surface of the piezoelectric layer 12, a first protective layer 20 which is laminated on the first electrode layer 16, a second electrode layer 14 which is laminated on the other surface of the piezoelectric layer 12, and a second protective layer 18 which is laminated on the second electrode layer 14.

As shown in FIG. 1, the piezoelectric layer 12 is a layer consisting of a polymer-based piezoelectric composite material which contains piezoelectric particles 26 in a polymer matrix 24 containing a polymer material. In addition, the first electrode layer 16 and the second electrode layer 14 are electrode layers of the present invention.

As will be described later, the piezoelectric film 10 (piezoelectric layer 12) is polarized in a thickness direction as a preferred embodiment.

As an example, the piezoelectric film 10 is used in various acoustic devices (audio equipment) such as speakers, microphones, and pickups used in musical instruments such as a guitar to generate (reproduce) sound through vibration in response to an electrical signal or to convert sound vibration into an electrical signal.

In addition, the piezoelectric film can also be used in pressure sensitive sensors, power generation elements, and the like in addition to the examples described above.

Alternatively, the piezoelectric film can also be used as an exciter which vibrates an article and generates sound by being brought into contact with and attached to various articles.

In the piezoelectric film 10, the second electrode layer 14 and the first electrode layer 16 form a pair of electrodes. That is, the piezoelectric film 10 has a configuration in which both surfaces of the piezoelectric layer 12 are sandwiched between the pair of electrodes, that is, the first electrode layer 16 and the second electrode layer 14, and this laminate is sandwiched between the first protective layer 20 and the second protective layer 18.

In this way, in the piezoelectric film 10, a region sandwiched between the first electrode layer 16 and the second electrode layer 14 stretches and contracts according to an applied voltage.

The first electrode layer 16 and the first protective layer 20, and the second electrode layer 14 and the second protective layer 18 are denoted in accordance with a polarization direction of the piezoelectric layer 12. Therefore, the first electrode layer 16 and the second electrode layer 14, and the first protective layer 20 and the second protective layer 18 have configurations that are basically the same as each other.

Furthermore, in addition to the above-described layers, the piezoelectric film 10 may include an insulating layer which covers a region where the piezoelectric layer 12 on a side surface or the like is exposed for preventing a short circuit or the like.

In a case where a voltage is applied to the first electrode layer 16 and the second electrode layer 14 of such a piezoelectric film 10, the piezoelectric particles 26 stretch and contract in the polarization direction according to the applied voltage. As a result, the piezoelectric film 10 (piezoelectric layer 12) contracts in the thickness direction. At the same time, the piezoelectric film 10 stretches and contracts in the in-plane direction due to a Poisson's ratio. A degree of stretch and contraction is approximately 0.01% to 0.1%. In the in-plane direction, the piezoelectric film 10 stretches and contracts isotropically in all directions.

A thickness of the piezoelectric layer 12 is preferably approximately 10 to 300 μm. Accordingly, the degree of stretch and contraction in the thickness direction is as extremely small as approximately 0.3 μm at the maximum.

On the contrary, the piezoelectric film 10, that is, the piezoelectric layer 12, has a size much larger than the thickness in a plane direction. Therefore, for example, in a case where a length of the piezoelectric film 10 is 20 cm, the piezoelectric film 10 stretches and contracts by a maximum of approximately 0.2 mm by the application of the voltage.

In addition, in a case where a pressure is applied to the piezoelectric film 10, electric power is generated by action of the piezoelectric particles 26.

By utilizing this, the piezoelectric film 10 can be used for various applications such as a speaker, a microphone, and a pressure sensitive sensor as described above.

Here, in the present invention, the piezoelectric film 10 has a configuration in which, in a case where a smaller value of a domain ratio X between a c domain and an a domain, which is measured by an X-ray diffraction method from one main surface side of the piezoelectric layer 12, or a domain ratio Y between a c domain and an a domain, which is measured by an X-ray diffraction method from the other main surface side of the piezoelectric layer 12, is set to 1.00, the other domain ratio is 1.05 or more. The details thereof will be described later.

Piezoelectric Layer

The piezoelectric layer is a layer consisting of a polymer-based piezoelectric composite material which contains piezoelectric particles in a matrix containing a polymer material, and is a layer which exhibits a piezoelectric effect in which the layer stretches and contracts in a case where a voltage is applied.

In the piezoelectric film 10, as a preferred embodiment, the piezoelectric layer 12 consists of a polymer-based piezoelectric composite material in which the piezoelectric particles 26 are dispersed in the polymer matrix 24 consisting of a polymer material having viscoelasticity at normal temperature. In the present specification, the "normal temperature" indicates a temperature range of approximately 0° C. to 50° C.

Here, it is preferable that the polymer-based piezoelectric composite material (piezoelectric layer 12) satisfies the following requirements.

(i) Flexibility

For example, in a case of being gripped in a state of being loosely bent with a sense of document such as a newspaper and a magazine as a portable device, the polymer-based piezoelectric composite material is continuously subjected to large bending deformation from the outside at a comparatively slow vibration of less than or equal to a few Hz. At this time, in a case where the polymer-based piezoelectric composite material is rigid, large bending stress is generated to that extent, and a crack is generated at an interface between the polymer matrix and the piezoelectric particles, which may lead to breakage. Accordingly, the polymer-based piezoelectric composite material is required to have suitable flexibility. In addition, in a case where strain energy is diffused into the outside as heat, the stress can be relaxed. Therefore, the polymer-based piezoelectric composite material is required to have a suitably large loss tangent.

(ii) Acoustic Quality

In a speaker, the piezoelectric particles vibrate at a frequency of an audio band of 20 Hz to 20 kHz, and vibration energy causes the entire polymer-based piezoelectric composite material (piezoelectric element) to vibrate integrally so that sound is reproduced. Therefore, in order to increase transmission efficiency of the vibration energy, the polymer-based piezoelectric composite material is required to have appropriate rigidity. In addition, in a case where frequency characteristics of the speaker are smooth, an amount of a change in acoustic quality decreases in a case where the lowest resonance frequency is changed in association with a change in curvature of the speaker. Therefore, the polymer-based piezoelectric composite material is required to have a suitably large loss tangent.

Accordingly, the polymer-based piezoelectric composite material is required to exhibit a behavior of being rigid with respect to a vibration of 20 Hz to 20 kHz and being flexible with respect to a vibration of less than or equal to a few Hz. In addition, the loss tangent of the polymer-based piezoelectric composite material is required to be suitably large with respect to the vibration of all frequencies of 20 kHz or less.

In general, a polymer solid has a viscoelasticity relaxing mechanism, and a molecular movement with a large scale is observed as a decrease (relief) in a storage elastic modulus (Young's modulus) or a maximal value (absorption) in a loss elastic modulus along with an increase in temperature or a decrease in frequency. Among these, the relaxation due to a microbrown movement of a molecular chain in an amorphous region is referred to as main dispersion, and an extremely large relaxing phenomenon is observed. A temperature at which this main dispersion occurs is a glass transition point (Tg), and the viscoelasticity relaxing mechanism is most remarkably observed.

In the polymer-based piezoelectric composite material (piezoelectric layer 12), the polymer-based piezoelectric composite material exhibiting a behavior of being rigid with respect to the vibration of 20 Hz to 20 kHz and being flexible with respect to the slow vibration of less than or equal to a few Hz is achieved by using, as a matrix, a polymer material having a glass transition point at normal temperature, that is, a polymer material having a viscoelasticity at normal temperature. In particular, from the viewpoint that such a behavior is suitably exhibited, it is preferable that a polymer material in which the glass transition point at a frequency of 1 Hz is at normal temperature, that is, in a range of 0° C. to 50° C. is used for a matrix of the polymer-based piezoelectric composite material.

As the polymer material having a viscoelasticity at normal temperature, various known materials can be used. It is preferable that a polymer material in which the maximal value of a loss tangent Tanδ at a frequency of 1 Hz according to a dynamic viscoelasticity test at normal temperature, that is, in a range of 0° C. to 50° C. is 0.5 or more is used as the polymer material.

In this manner, in a case where the polymer-based piezoelectric composite material is slowly bent due to an external force, stress concentration on the interface between the polymer matrix and the piezoelectric particles at the maximum bending moment portion is relaxed, and thus high flexibility can be expected.

In the polymer material having a viscoelasticity at normal temperature, it is preferable that a storage elastic modulus (E') at a frequency of 1 Hz according to the dynamic viscoelasticity measurement is 100 MPa or more at 0° C. and 10 MPa or less at 50° C.

In this manner, a bending moment generated in a case where the polymer-based piezoelectric composite material is slowly bent due to the external force can be reduced, and at the same time, the polymer-based piezoelectric composite material can exhibit a behavior of being rigid with respect to an acoustic vibration of 20 Hz to 20 kHz.

In addition, it is more suitable that a relative permittivity of the polymer material having a viscoelasticity at normal temperature is 10 or more at 25° C. Accordingly, in a case where a voltage is applied to the polymer-based piezoelectric composite material, a higher electric field is applied to the piezoelectric particles in the polymer matrix, and thus a large deformation amount can be expected.

However, in consideration of ensuring favorable moisture resistance and the like, it is suitable that the relative permittivity of the polymer material is 10 or less at 25° C.

Examples of the polymer material having a viscoelasticity at normal temperature and satisfying such conditions include cyanoethylated polyvinyl alcohol (cyanoethylated PVA), polyvinyl acetate, poly(vinylidene chloride-co-acrylonitrile), a polystyrene-vinyl polyisoprene block copolymer, polyvinyl methyl ketone, and polybutyl methacrylate. In addition, as these polymer materials, a commercially available product such as Hybrar 5127 (manufactured by Kuraray Co., Ltd.) can also be suitably used. Among these, as the polymer material, a material having a cyanoethyl group is preferably used, and cyanoethylated PVA is particularly preferably used.

These polymer materials may be used alone or in combination (mixture) of a plurality of kinds thereof.

The polymer matrix 24 using such a polymer material having a viscoelasticity at normal temperature may use a plurality of polymer materials in combination as necessary.

That is, in order to control dielectric properties, mechanical properties, or the like, other dielectric polymer materials may be added to the polymer matrix 24 as necessary, in addition to the viscoelastic material such as cyanoethylated PVA.

Examples of the dielectric polymer material which can be added thereto include fluorine-based polymers such as polyvinylidene fluoride, a vinylidene fluoride-tetrafluoroethylene copolymer, a vinylidene fluoride-trifluoroethylene copolymer, a polyvinylidene fluoride-trifluoroethylene copolymer, and a polyvinylidene fluoride-tetrafluoroethylene copolymer; polymers having a cyano group or a cyanoethyl group, such as a vinylidene cyanide-vinyl acetate copolymer, cyanoethyl cellulose, cyanoethyl hydroxysaccharose, cyanoethyl hydroxycellulose, cyanoethyl hydroxypullulan, cyanoethyl methacrylate, cyanoethyl acrylate, cyanoethyl hydroxyethyl cellulose, cyanoethyl amylose, cyanoethyl hydroxypropyl cellulose, cyanoethyl dihydroxypropyl cellulose, cyanoethyl hydroxypropyl amylose, cyanoethyl polyacrylamide, cyanoethyl polyacrylate, cyanoethyl pullulan, cyanoethyl polyhydroxymethylene, cyanoethyl glycidol pullulan, cyanoethyl saccharose, and cyanoethyl sorbitol; and synthetic rubber such as nitrile rubber and chloroprene rubber.

Among these, a polymer material having a cyanoethyl group is suitably used.

In addition, the dielectric polymer added to the polymer matrix 24 of the piezoelectric layer 12 in addition to the material having a viscoelasticity at normal temperature, such as cyanoethylated PVA, is not limited to one dielectric polymer, and a plurality of kinds of dielectric polymers may be added.

In addition, for the purpose of controlling the glass transition point Tg, a thermoplastic resin such as a vinyl chloride resin, polyethylene, polystyrene, a methacrylic resin, polybutene, and isobutylene, and a thermosetting resin such as a phenol resin, a urea resin, a melamine resin, an alkyd resin, and mica may be added to the polymer matrix 24 in addition to the dielectric polymer material.

Furthermore, for the purpose of improving pressure sensitive adhesiveness, a viscosity imparting agent such as rosin ester, rosin, terpene, terpene phenol, and a petroleum resin may be added.

In the polymer matrix 24 of the piezoelectric layer 12, the addition amount in a case of adding materials other than the polymer material having a viscoelasticity, such as cyanoethylated PVA, is not particularly limited, but is preferably set to 30% by mass or less in terms of a proportion of the materials in the polymer matrix 24.

In this manner, characteristics of the polymer material to be added can be exhibited without impairing the viscoelasticity relaxing mechanism in the polymer matrix 24, so that preferred results such as an increase in permittivity, improvement of heat resistance, and improvement of adhesiveness between the piezoelectric particles 26 and the electrode layer can be obtained.

The piezoelectric layer 12 contains the piezoelectric particles 26 in such a polymer matrix 24.

The piezoelectric particles 26 consist of ceramic particles having a perovskite type or wurtzite type crystal structure.

Examples of the ceramic particles constituting the piezoelectric particles 26 include lead zirconate titanate (PZT), lead lanthanum zirconate titanate (PLZT), barium titanate ($BaTiO_3$), zinc oxide (ZnO), and a solid solution (BFBT) of barium titanate and bismuth ferrite ($BiFe_3$).

Only one of these piezoelectric particles 26 may be used, or a plurality of kinds thereof may be used in combination (mixture).

A particle diameter of the piezoelectric particles 26 is not limited, and may be suitably selected depending on the size of the piezoelectric film 10 and the applications of the piezoelectric film 10.

The particle diameter of the piezoelectric particles 26 is preferably 1 to 10 μm. By setting the particle diameter of the piezoelectric particles 26 to be within the above-described range, preferred results in terms of achieving both excellent piezoelectric characteristics and flexibility of the piezoelectric film 10 can be obtained.

In FIG. 1, the piezoelectric particles 26 in the piezoelectric layer 12 are irregularly dispersed in the polymer matrix 24, but the present invention is not limited thereto. That is, the piezoelectric particles 26 in the piezoelectric layer 12 may be regularly dispersed in the polymer matrix 24 as long as the piezoelectric particles 26 are preferably uniformly dispersed therein.

In the piezoelectric film 10, a ratio between an amount of the polymer matrix 24 and an amount of the piezoelectric particles 26 in the piezoelectric layer 12 is not limited, and may be appropriately set according to the size and the thickness of the piezoelectric film 10 in the plane direction, the applications of the piezoelectric film 10, the characteristics required for the piezoelectric film 10, and the like.

A volume fraction of the piezoelectric particles 26 in the piezoelectric layer 12 is preferably 30% to 80%, more preferably 50% or more, and still more preferably 50% to 80%.

By setting the ratio between the amount of the polymer matrix 24 and the amount of the piezoelectric particles 26 to be within the above-described range, preferred results in terms of achieving both of excellent piezoelectric characteristics and flexibility can be obtained.

In the piezoelectric film 10 described above, as a preferred embodiment, the piezoelectric layer 12 is a polymer-based piezoelectric composite material layer in which piezoelectric particles are dispersed in a viscoelastic matrix containing a polymer material having a viscoelasticity at normal temperature. However, the present invention is not limited thereto, and a polymer-based piezoelectric composite material in which piezoelectric particles are dispersed in a matrix containing a polymer material, which is used in a known piezoelectric element, can be used as a piezoelectric layer.

A thickness of the piezoelectric layer 12 in the piezoelectric film 10 is not particularly limited, and may be appropriately set according to the applications of the piezoelectric film 10, the characteristics required for the piezoelectric film 10, and the like.

It is advantageous that the thickness of the piezoelectric layer 12 increases large in terms of stiffness such as the strength of rigidity of a so-called sheet-like material, but the voltage (potential difference) required to stretch and contract the piezoelectric film 10 increases by the same amount.

The thickness of the piezoelectric layer 12 is preferably 10 to 300 μm, more preferably 20 to 200 μm, and still more preferably 30 to 150 μm.

By setting the thickness of the piezoelectric layer 12 to be within the above-described ranges, preferred results in terms of achieving both ensuring of the rigidity and moderate elasticity can be obtained.

Protective Layer

The first protective layer 20 and the second protective layer 18 in the piezoelectric film 10 have a function of coating the second electrode layer 14 and the first electrode layer 16 and imparting moderate rigidity and mechanical strength to the piezoelectric layer 12. That is, the piezoelectric layer 12 consisting of the polymer matrix 24 and the piezoelectric particles 26 in the piezoelectric film 10 exhibits extremely excellent flexibility under bending deformation at a slow vibration, but may have insufficient rigidity or mechanical strength depending on the applications. As a compensation for this, the piezoelectric film 10 is provided with the first protective layer 20 and the second protective layer 18.

The first protective layer 20 and the second protective layer 18 are not limited and various sheet-like materials can be used, and suitable examples thereof include various resin films.

Among these, from the viewpoint of excellent mechanical characteristics and heat resistance, a resin film consisting of polyethylene terephthalate (PET), polypropylene (PP), polystyrene (PS), polycarbonate (PC), polyphenylene sulfite (PPS), polymethylmethacrylate (PMMA), polyetherimide (PEI), polyimide (PI), polyethylene naphthalate (PEN), triacetyl cellulose (TAC), a cyclic olefin-based resin, and the like is suitably used.

Thicknesses of the first protective layer 20 and the second protective layer 18 are not limited. In addition, the thicknesses of the first protective layer 20 and the second protective layer 18 are basically the same as each other, but may be different from each other.

Here, in a case where the rigidity of the first protective layer 20 and the second protective layer 18 is extremely high, not only is the stretch and contraction of the piezoelectric layer 12 constrained, but also the flexibility is impaired. Therefore, it is advantageous that the thicknesses of the first protective layer 20 and the second protective layer 18 decrease except for the case where the mechanical strength or favorable handleability as a sheet-like material is required.

The thicknesses of the first protective layer 20 and the second protective layer 18 are preferably 3 μm to 100 μm, more preferably 3 μm to 50 μm, still more preferably 3 μm to 30 μm, and particularly preferably 4 μm to 10 μm.

In a case where the thicknesses of the first protective layer 20 and the second protective layer 18 in the piezoelectric film 10 are two times or less the thickness of the piezoelectric layer 12, preferred results in terms of achieving both ensuring of the rigidity and moderate elasticity can be obtained.

For example, in a case where the thickness of the piezoelectric layer 12 is 50 μm and the first protective layer 20 and the second protective layer 18 consist of PET, the thicknesses of the first protective layer 20 and the second protective layer 18 are preferably 100 μm or less, more preferably 50 μm or less, and still more preferably 25 μm or less.

Electrode Layer

In the piezoelectric film 10, the first electrode layer 16 is formed between the piezoelectric layer 12 and the first protective layer 20, and the second electrode layer 14 is formed between the piezoelectric layer 12 and the second protective layer 18. The first electrode layer 16 and the second electrode layer 14 are provided to apply a voltage to the piezoelectric layer 12 (piezoelectric film 10).

In the present invention, a material for forming the first electrode layer 16 and the second electrode layer 14 is not limited, and various conductors can be used. Specific examples thereof include metals such as carbon, palladium, iron, tin, aluminum, nickel, platinum, gold, silver, copper, titanium, chromium, and molybdenum, alloys thereof, laminates and composites of these metals and alloys, and indium tin oxide. Among these, copper, aluminum, gold, silver, platinum, or indium tin oxide is suitable as the material of the first electrode layer 16 and the second electrode layer 14.

In addition, a method of forming the first electrode layer 16 and the second electrode layer 14 is not limited, and various known methods, for example, a vapor-phase deposition method (a vacuum film forming method) such as vacuum vapor deposition, ion-assisted vapor deposition, and sputtering, a film forming method of using plating, and a method of bonding a foil formed of the above-described materials can be used.

Thicknesses of the first electrode layer 16 and the second electrode layer 14 are not limited. In addition, the thicknesses of the first electrode layer 16 and the second electrode layer 14 are basically the same as each other, but may be different from each other.

Here, same as the first protective layer 20 and the second protective layer 18 described above, in a case where the rigidity of the first electrode layer 16 and the second electrode layer 14 is extremely high, not only the stretch and contraction of the piezoelectric layer 12 is constrained, but also the flexibility is impaired. Therefore, it is advantageous that the thicknesses of the first electrode layer 16 and the second electrode layer 14 decrease in a case where electric resistance is not extremely high. That is, it is preferable that the first electrode layer 16 and the second electrode layer 14 are thin film electrodes.

The thicknesses of the first electrode layer 16 and the second electrode layer 14 are less than the thickness of the protective layer, and are preferably 0.05 μm to 10 μm, more preferably 0.05 μm to 5 μm, still more preferably 0.08 μm to 3 μm, and particularly preferably 0.1 μm to 2 μm.

Here, in the piezoelectric film 10, from the viewpoint that the flexibility is not considerably impaired, it is suitable that a product of the thickness and the Young's modulus of the first electrode layer 16 and the second electrode layer 14 is less than a product of the thickness and the Young's modulus of the first protective layer 20 and the second protective layer 18.

For example, in a combination in which the first protective layer 20 and the second protective layer 18 consist of PET (Young's modulus: approximately 6.2 GPa) and the first electrode layer 16 and the second electrode layer 14 consist of copper (Young's modulus: approximately 130 GPa), in a case where the thicknesses of the first protective layer 20 and the second protective layer 18 are assumed to be 25 μm, the thicknesses of the first electrode layer 16 and the second electrode layer 14 are preferably 1.2 μm or less, more preferably 0.3 μm or less, and still more preferably 0.1 μm or less.

As described above, it is preferable that the piezoelectric film 10 has a configuration in which the piezoelectric layer 12 obtained by dispersing the piezoelectric particles 26 in the polymer matrix 24 containing the polymer material having a viscoelasticity at normal temperature is sandwiched between the first electrode layer 16 and the second electrode layer 14, and this laminate is sandwiched between the first protective layer 20 and the second protective layer 18.

In such a piezoelectric film 10, it is preferable that the maximal value of the loss tangent (tanδ) at a frequency of 1 Hz according to the dynamic viscoelasticity measurement is present at normal temperature, and it is more preferable that the maximal value at which the loss tangent is 0.1 or more is present at normal temperature.

In this manner, even in a case where the piezoelectric film 10 is subjected to large bending deformation at a relatively slow vibration of less than or equal to a few Hz from the outside, since the strain energy can be effectively diffused to the outside as heat, occurrence of cracks at the interface between the polymer matrix and the piezoelectric particles can be prevented.

In the piezoelectric film 10, it is preferable that the storage elastic modulus (E') at a frequency of 1 Hz according to the dynamic viscoelasticity measurement is 10 to 30 GPa at 0° C. and 1 to 10 GPa at 50° C. The same applies to the conditions for the piezoelectric layer 12.

In such a manner, the piezoelectric film 10 may have large frequency dispersion in the storage elastic modulus (E') at normal temperature. That is, the piezoelectric film 10 can exhibit a behavior of being rigid with respect to the vibration of 20 Hz to 20 kHz and being flexible with respect to the vibration of less than or equal to a few Hz.

In the piezoelectric film 10, it is preferable that a product of the thickness and the storage elastic modulus (E') at a frequency of 1 Hz according to the dynamic viscoelasticity measurement is $1.0\times10^6$ to $2.0\times10^6$ N/m at 0° C. and $1.0\times10^5$ to $1.0\times10^6$ N/m at 50° C. The same applies to the conditions for the piezoelectric layer 12.

In this manner, the piezoelectric film 10 may have moderate rigidity and mechanical strength within a range not impairing the flexibility and the acoustic characteristics.

Furthermore, in the piezoelectric film 10, it is preferable that the loss tangent (Tanδ) at a frequency of 1 kHz at 25° C. is 0.05 or more in a master curve obtained from the dynamic viscoelasticity measurement. The same applies to the conditions for the piezoelectric layer 12.

In this manner, the frequency characteristics of the speaker including the piezoelectric film 10 are smooth, so that an amount of change in acoustic quality in a case where the lowest resonance frequency $f_0$ is changed according to a change in curvature of the speaker can be decreased.

In addition, in the present invention, the storage elastic modulus (Young's modulus) and the loss tangent of the piezoelectric film 10, the piezoelectric layer 12, and the like may be measured by a known method. As an example, the measurement may be performed using a dynamic viscoelasticity measuring device DMS6100 (manufactured by SII Nanotechnology Inc.).

Examples of measurement conditions include conditions with a measurement frequency of 0.1 Hz to 20 Hz (0.1 Hz, 0.2 Hz, 0.5 Hz, 1 Hz, 2 Hz, 5 Hz, 10 Hz, and 20 Hz), a measurement temperature of −50° C. to 150° C., a temperature rising rate of 2° C./min (in a nitrogen atmosphere), a sample size of 40 mm×10 mm (including the clamped region), and a chuck-to-chuck distance of 20 mm.

In addition to the piezoelectric layer, the electrode layers, and the protective layers, for example, the piezoelectric film 10 may further include an electrode lead-out portion which leads out the electrodes from the first electrode layer 16 and the second electrode layer 14, an insulating layer which covers a region where the piezoelectric layer 12 is exposed for preventing a short circuit or the like, and the like.

The electrode lead-out portion may be configured such that a portion where the electrode layer and the protective layer project convexly outside the piezoelectric layer in the plane direction is provided, or configured such that a part of the protective layer is removed to form a hole portion and a conductive material such as silver paste is inserted into the hole portion so that the conductive material is conducted with the electrode layer.

The number of electrode lead-out portions is not limited to one, and each electrode layer may have two or more electrode lead-out portions. Particularly, in a case of the configuration in which the electrode lead-out portion is obtained by removing a part of the protective layer and inserting a conductive material into the hole portion, it is preferable that the electrode layer has three or more electrode lead-out portions in order to more reliably ensure the conduction.

Here, in the piezoelectric film 10 according to the embodiment of the present invention, in a case where a smaller value of a domain ratio X between a c domain and an a domain, which is measured by an X-ray diffraction method from one main surface side of the piezoelectric layer 12, or a domain ratio Y between a c domain and an a domain, which is measured by an X-ray diffraction method from the other main surface side of the piezoelectric layer 12, is set to 1.00, the other domain ratio is 1.05 or more.

As described above, in a case where a voltage is applied to the piezoelectric film, the piezoelectric layer of the piezoelectric film stretches and contracts greatly in an in-plane direction, but since end parts of the piezoelectric film are fixed to a support member, the piezoelectric layer in the piezoelectric film is greatly warped. In a case where the warping occurs, a difference occurs in the degree of stretching and contracting of the piezoelectric layer in the thickness direction. The difference in degree of stretching and contracting in the piezoelectric layer applies a large stress to the piezoelectric layer itself, causing defects such as cracks and peeling inside the piezoelectric layer. Therefore, there is a problem that acoustic characteristics such as sound pressure in a case where the same electrical signal is applied, that is, conversion efficiency between the electrical signal and the vibration (sound) deteriorates with the use of a long period of time.

On the other hand, according to the study conducted by the present inventors, in the piezoelectric layer consisting of the polymer-based piezoelectric composite material, in a case where there is a bias in a polarization degree in the thickness direction, that is, in the ratio between the c domain and the a domain, it has been found that this bias plays a role in relaxing the difference in degree of stretching and contracting caused by the warping of the piezoelectric film, and can reduce stress on the piezoelectric layer itself. Therefore, in the piezoelectric film according to the embodiment of the present invention, by setting the ratio between the ratio X=c domain/a domain of the c domain and the a domain on one surface side of the piezoelectric layer and the ratio Y=c domain/a domain of the c domain and the a domain in the other surface side to be 1.05 or more, the polarization degree is biased in the thickness direction of the piezoelectric layer, so that the difference in degree of stretching and contracting caused by the warping of the piezoelectric film is relaxed and the stress on the piezoelectric layer itself can be reduced. In this manner, in the piezoelectric film according to the embodiment of the present invention, defects such as cracks and peeling can be suppressed from occurring inside the piezoelectric layer even in a case of being used for a long period of time, the decrease in acoustic characteristics such as sound pressure caused by the defects (conversion efficiency between electric vibration and vibration (sound)) can be suppressed, and the durability can be increased.

Hereinafter, the c domain and the a domain of the piezoelectric layer will be described.

As described above, in the piezoelectric film using the polymer-based piezoelectric composite material formed by dispersing the piezoelectric particles in the polymer matrix as the piezoelectric layer, a ferroelectric material such as PZT is used as the piezoelectric particles. A crystal structure of the ferroelectric material is divided into a plurality of domains in which directions of spontaneous polarization are different from each other, and in this state, since the spontaneous polarization of each domain and the resulting piezoelectric effect cancel each other out, no piezoelectric characteristics are observed as a whole.

Therefore, in the piezoelectric film of the related art, by applying electrical polarization treatment such as poling to the piezoelectric layer and applying an electric field of a certain value or more from the outside, the direction of spontaneous polarization in each domain is aligned. The piezoelectric particles subjected to the electrical polarization treatment exhibit a piezoelectric effect in response to the electric field from the outside. In this manner, the piezoelectric film itself stretches and contracts in the plane direction and vibrates in a direction perpendicular to the plane in response to the applied voltage, so that the piezoelectric film converts the vibration (sound) to an electrical signal.

Meanwhile, the direction of spontaneous polarization of each domain in the crystal structure of the ferroelectric material (hereinafter, also simply referred to as the direction of the domain) is aligned not only in the thickness direction of the piezoelectric film but also in various directions such as the plane direction. Therefore, for example, even in a case where the electrical polarization treatment is performed by applying a higher voltage, it is not possible to direct all the directions of the domains aligned in the plane direction to the thickness direction by applying an electric field. In other words, it is not possible to completely remove 90° domain.

In general, an X-ray diffraction method (XRD) has been used as a method of analyzing the crystal structure of such a piezoelectric layer (piezoelectric particles) to investigate how atoms are arranged inside the crystal.

Here, the c domain is a domain of the piezoelectric film in the thickness direction, which corresponds to a (002) plane peak intensity. The c domain is a peak of tetragonal particles near 43.5° in an XRD pattern obtained by the XRD analysis. The a domain is a domain of the piezoelectric film in the in-plane direction, which corresponds to a (200) plane peak intensity. The a domain is a peak of tetragonal particles near 45° in the XRD pattern obtained by the XRD analysis.

The XRD analysis can be carried out using an X-ray diffractometer (X'Pert PRO manufactured by Malvern Panalytical Ltd.).

Hereinafter, a measuring method of the domain ratio will be described.

Figure 2:
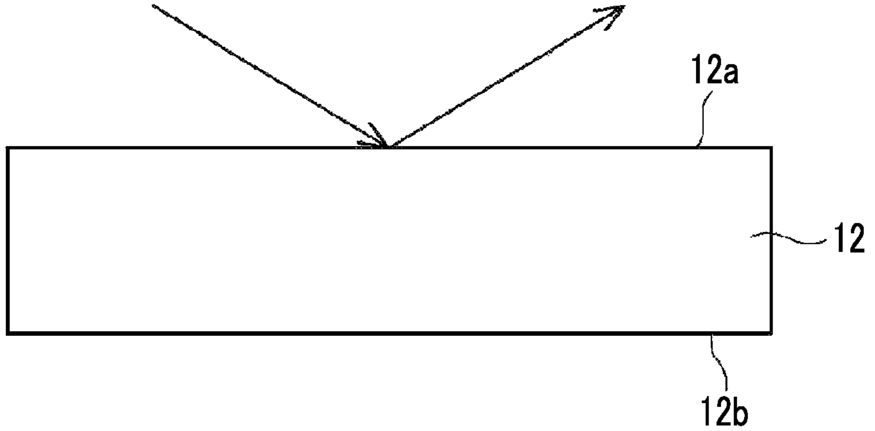
FIG. 2 is a conceptual view for describing a measuring method of a domain ratio of a piezoelectric layer.
Figure 3:
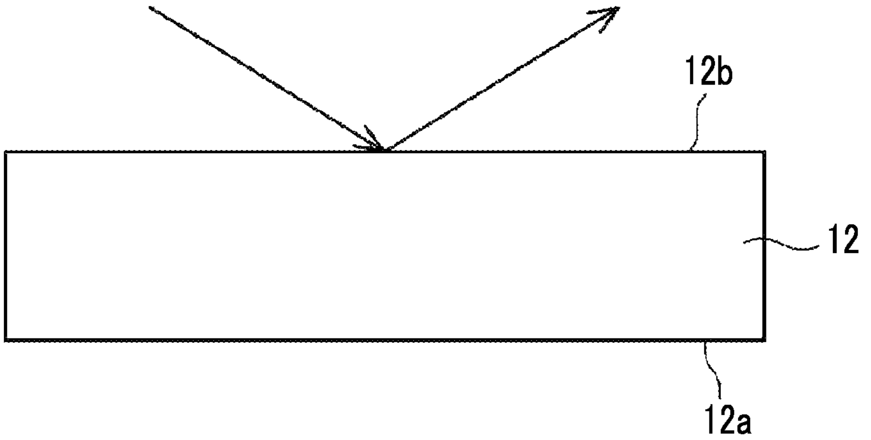
FIG. 3 is a conceptual view for describing the measuring method of the domain ratio of the piezoelectric layer.

First, as shown in FIG. 2, an XRD analysis is performed by irradiating one surface 12*a* of the piezoelectric layer 12 with X-rays (indicated by an arrow in FIG. 2) to measure the c domain and the a domain, and the domain ratio X (=c domain/a domain) is calculated. Next, as shown in FIG. 3, an XRD analysis is performed by irradiating the other surface 12*b* of the piezoelectric layer 12 with X-rays (indicated by an arrow in FIG. 3) to measure the c domain and the a domain, and the domain ratio Y (=c domain/a domain) is calculated.

Among the measured domain ratios X and Y, a smaller value is set to 1.00, and a ratio of the domain ratio having a larger value is calculated. That is, a value obtained by dividing the domain ratio having a larger value by the domain ratio having a smaller value is calculated. Hereinafter, the value obtained by dividing the domain ratio having a larger value by the domain ratio having a smaller value is defined as a ratio Z.

Such measurement may be performed at optional five points with an interval of 10 mm or more in the plane direction (vertical direction of the thickness direction) of the piezoelectric layer to calculate an average value of the ratios Z.

In a case where the piezoelectric film is folded and laminated, the XRD analysis is carried out by peeling off laminated layers to form a sheet.

Here, from the viewpoint of durability or the like, the ratio Z is preferably 1.05 to 1.86 and more preferably 1.09 to 1.48. In a case where the ratio Z is extremely high, since the surface on the side with a smaller domain ratio hardly stretches and contracts, stretch and contraction of the opposite surface may also be constrained, which leads to a decrease in initial sound pressure.

In addition, since higher piezoelectric characteristics can be obtained as the proportion of the domain (c domain) of the piezoelectric film in the thickness direction is larger, from the viewpoint of increasing the conversion efficiency between the electrical signal and the vibration (sound), it is preferable that the ratios (domain ratio X and domain ratio Y) between the c domain and the a domain are high. Therefore, an average value of the domain ratio X and the domain ratio Y is preferably 2 or more, more preferably 3 to 4.1, and still more preferably 3.4 to 4.0.

In addition, as the proportion of the domain (a domain) in the plane direction is large, in a case where a driving voltage is applied, a domain wall moves by 90° , which causes hysteresis of distortion, and there is concern that distortion may occur in the reproduced sound. From this viewpoint, it is preferable that the average value of the domain ratio X and the domain ratio Y is set to be within the above-described range, so that the 90° domain motion in a case of applying the driving voltage is reduced and the distortion of the reproduced sound is reduced.

Next, an example of a manufacturing method of the piezoelectric film 10 will be described with reference to FIGS. 4 to 6.

Figure 4:
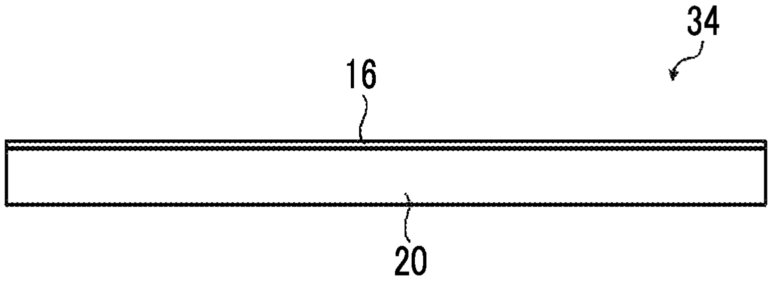
FIG. 4 is a conceptual view for describing an example of a production method of the piezoelectric film.
Figure 5:
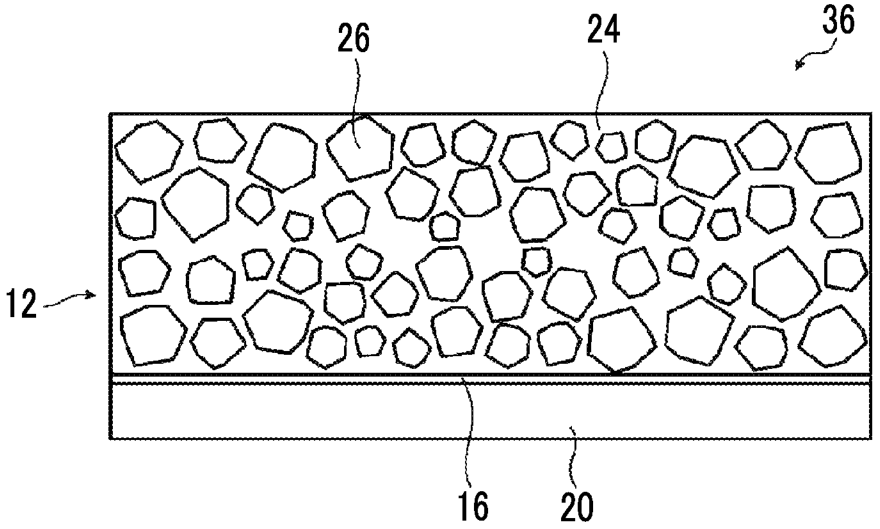
FIG. 5 is a conceptual view for describing an example of a production method of the piezoelectric film.

First, as shown in FIG. 4, a sheet-like material 34 in which the first electrode layer 16 has been formed on the first protective layer 20 is prepared. The sheet-like material 34 may be prepared by forming a copper thin film or the like as the first electrode layer 16 on the surface of the first protective layer 20 using vacuum vapor deposition, sputtering, plating, or the like.

In a case where the first protective layer 20 is extremely thin and thus the handleability is degraded, the first protective layer 20 with a separator (temporary support) may be used as necessary. PET having a thickness of 25 μm to 100 μm, or the like can be used as the separator. The separator may be removed after thermal compression bonding of the second electrode layer 14 and the second protective layer 18 and before lamination of any member on the first protective layer 20.

Meanwhile, a coating material is prepared by dissolving a polymer material serving as a material of the matrix in an organic solvent, adding the piezoelectric particles 26 such as PZT particles thereto, and stirring the solution for dispersion.

The organic solvent other than the above-described substances is not limited, and various organic solvents can be used.

In a case where the sheet-like material 34 is prepared and the coating material is prepared, the coating material is cast (applied) onto the sheet-like material 34, and the organic solvent is evaporated and dried. In this manner, as shown in FIG. 5, a laminate 36 in which the first electrode layer 16 is provided on the first protective layer 20 and the piezoelectric layer 12 is formed on the first electrode layer 16 is produced. The first electrode layer 16 refers to an electrode on the substrate side in a case where the piezoelectric layer 12 is applied, and does not indicate a vertical positional relationship in the laminate.

A casting method of the coating material is not limited, and all known methods (coating devices) such as a slide coater and a doctor knife can be used.

As described above, in the piezoelectric film 10, in addition to the viscoelastic material such as cyanoethylated PVA, a dielectric polymer material may be added to the polymer matrix 24.

In a case where the polymer material is added to the polymer matrix 24, the polymer material added to the coating material may be dissolved.

In a case where the laminate 36 in which the first electrode layer 16 is provided on the first protective layer 20 and the piezoelectric layer 12 is formed on the first electrode layer 16 is produced, it is preferable that the piezoelectric layer 12 is subjected to the electrical polarization treatment (poling).

The domain (180° domain) in the thickness direction, which is aligned in a direction opposite to the direction in which the electric field is applied, is switched by the electrical polarization treatment, that is, 180° domain motion occurs, so that the direction of the domain in the thickness direction can be aligned.

A method of performing the polarization treatment on the piezoelectric layer 12 is not limited, and a known method can be used. The domain ratio (=c domain/a domain) in the piezoelectric layer can be adjusted by adjusting the electric field strength, the temperature, and the like during the polarization treatment.

Before the polarization treatment, a calender treatment may be performed to smoothen the surface of the piezoelectric layer 12 using a heating roller or the like. By performing the calender treatment, a thermal compression bonding step described later can be smoothly performed.

In this manner, while the piezoelectric layer 12 of the laminate 36 is subjected to the polarization treatment as described above, a sheet-like material 38 in which the second electrode layer 14 is formed on the second protective layer 18 is prepared. The sheet-like material 38 may be prepared by forming a copper thin film or the like as the second electrode layer 14 on the surface of the second protective layer 18 using vacuum vapor deposition, sputtering, plating, or the like.

Figure 6:
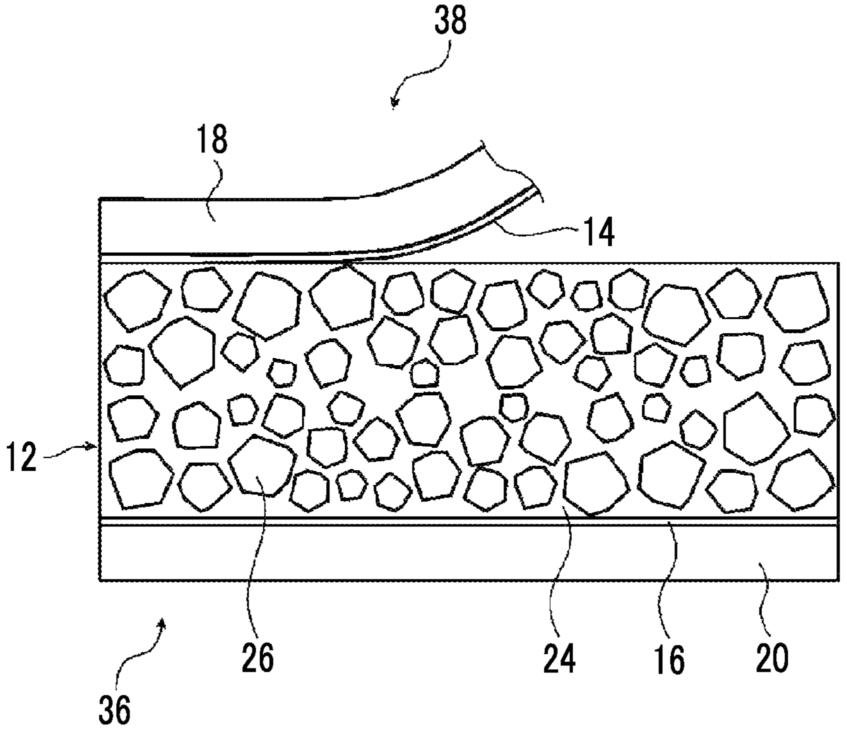
FIG. 6 is a conceptual view for describing an example of a production method of the piezoelectric film.

Next, as shown in FIG. 6, the sheet-like material 38 is laminated on the laminate 36 in which the polarization treatment performed on the piezoelectric layer 12 is completed in a state where the second electrode layer 14 is directed toward the piezoelectric layer 12.

Furthermore, a laminate of the laminate 36 and the sheet-like material 38 is subjected to thermal compression bonding using a heating press device, a heating roller pair, or the like such that the second protective layer 18 and the first protective layer 20 are sandwiched between the laminate 36 and the sheet-like material 38.

A heating temperature during the thermal compression bonding is preferably 50° C. to 80° C. and more preferably 60° C. to 70° C. In addition, a heating time is preferably 10 to 60 seconds and more preferably 20 to 40 seconds.

In addition, in the present invention, a mechanical polarization treatment may be performed in addition to or instead of the electrical polarization treatment.

The mechanical polarization treatment is a treatment in which, by applying a shear stress to the piezoelectric layer 12 of the laminate of the laminate 36 and the sheet-like material 38, the proportion of the a domain facing the plane direction is decreased and the proportion of the c domain facing the thickness direction is increased.

The reason why the proportion of the c domain is increased by applying the shear stress to the piezoelectric layer 12 is presumed as follows.

In a case where the shear stress is applied to the piezoelectric layer 12 (piezoelectric particles 26), the piezoelectric particles 26 have no choice but to extend in a machine direction (thickness direction), so that, at this time, the 90° domain motion occurs, and the a domain facing the plane direction is to be the c domain facing the thickness direction. In addition, the orientation of the c domain facing the thickness direction does not change. As a result, it is presumed that the proportion of the a domain is decreased and the proportion of the c domain is increased.

In this manner, the domain ratio can be increased by performing the mechanical polarization treatment to decrease the proportion of the a domain and increase the proportion of the c domain.

Here, in the present invention, it is preferable to perform the mechanical polarization treatment after the electrical polarization treatment.

The 90° domain motion generated by the mechanical polarization treatment is likely to occur as the 180° domain wall is eliminated.

Therefore, the proportion of the c domain can be increased by causing the 180° domain motion by the electrical polarization treatment and eliminating the 180° domain wall in a state where the 90° domain motion is likely to occur, and then by causing the 90° domain motion by the mechanical polarization treatment and aligning the a domain facing the plane direction to the c domain facing the thickness direction.

In the mechanical polarization treatment, examples of a method of applying the shear stress to the piezoelectric layer 12 include a method of pressing a roller from one surface side of the laminate of the laminate 36 and the sheet-like material 38.

The type of the roller in a case where the shear stress is applied to the piezoelectric layer 12 using a roller is not particularly limited, and a rubber roller, a metal roller, or the like can be appropriately used.

In addition, the value of the shear stress applied to the piezoelectric layer 12 is not particularly limited, and may be appropriately set according to the performance required for the piezoelectric film, the material and thickness of each layer of the piezoelectric film, and the like. As an example, the shear stress applied to the piezoelectric layer 12 is preferably 0.3 MPa to 0.5 MPa.

The shear stress applied to the piezoelectric layer 12 may be acquired by dividing applied shear load by a cross-sectional area parallel to the shear load, or may be acquired by detecting tensile strain or compressive strain caused by tensile or compressive stress, and calculating the shear stress from the detection result.

In addition, in a case where the shear stress is applied to the piezoelectric layer 12 using a roller, a temperature of the laminate and the roller is preferably 20° C. to 130° C. and more preferably 50° C. to 100° C. In a case where the temperature is too high, the polymer material is too soft, which makes it difficult for the shearing force to be transmitted, and in a case where the temperature is low, the polymer material is too rigid, which makes it difficult to change the domain ratio. Therefore, it is considered that, by maintaining the temperature at an appropriate temperature at which the polymer material is in a soft state, the domain ratio can be easily changed.

Here, in the present invention, in order to make the domain ratio (=c domain/a domain) biased between one main surface side and the other main surface side, that is, in order to set the ratio Z to be 1.05 or more, after performing the thermal compression bonding and the polarization treatment of the laminate 36 and the sheet-like material 38, there is a further step of heating only the one main surface side of the piezoelectric film. In this case, it is preferable that the other main surface side is not heated. By heating only the one main surface side of the piezoelectric film, the proportion of the c domain of the piezoelectric particles 26 in the piezoelectric layer 12 on the heated side is reduced, and the domain ratio (=c domain/a domain) on the one main surface side is decreased. As a result, it is possible to have a bias in the domain ratio (=c domain/a domain) between one main surface side and the other main surface side.

A heating method in the step of heating one main surface side is not particularly limited, and the heating can be carried out using a heating press device, a heating roller pair, or the like. In addition, in order to prevent the other main surface side from being heated, it is preferable to cool the other main surface side.

From the viewpoint of biasing the domain ratio (=c domain/a domain) between one main surface side and the other main surface side, it is necessary to increase a heating temperature and lengthen a heating time to some extent, but in a case where the heating temperature is too high and/or the heating time is long, the proportion of the c domain may be too small, or the temperature on the other main surface side may rise, causing the domain ratio on the other main surface side to be also small. From the above viewpoints, the heating temperature in the step of heating one main surface side is preferably 90° C. to 150° C. and more preferably 100° C. to 120° C. In addition, the heating time is preferably 100 to 600 seconds and more preferably 120 to 300 seconds.

The piezoelectric film according to the embodiment of the present invention can be produced by performing the above-described steps. With the produced piezoelectric film, a step of cutting the film into a desired shape after the above-described steps may be provided.

In addition, the above-described steps can also be performed by using a web-like material, that is, a material wound up in a state where long sheets are connected without using a sheet-like material, during transport. Both the laminate 36 and the sheet-like material 38 can have a web shape and can be subjected to thermal compression bonding as described above. In this case, the piezoelectric film 10 is produced in a web shape at this moment.

Furthermore, a special glue layer may be provided in a case where the laminate 36 and the sheet-like material 38 are bonded to each other. For example, a glue layer may be provided on the surface of the second electrode layer 14 in the sheet-like material 38. The most suitable glue layer is the same material as the polymer matrix 24. The surface of the second electrode layer 14 can be coated with the same material as described above so that the laminate and the sheet-like material can be bonded to each other.

Figure 7:
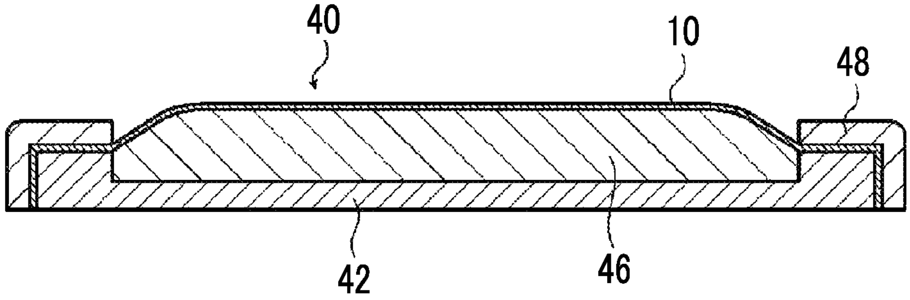
FIG. 7 is a view conceptually showing an example of a piezoelectric speaker using the piezoelectric film shown in FIG. 1.

FIG. 7 is a conceptual view showing an example of a flat plate type piezoelectric speaker including the piezoelectric film 10 according to the embodiment of the present invention.

A piezoelectric speaker 40 is a flat plate type piezoelectric speaker which uses the piezoelectric film 10 according to the embodiment of the present invention as a vibration plate converting an electrical signal into vibration energy. The piezoelectric speaker 40 can also be used as a microphone, a sensor, or the like.

The piezoelectric speaker 40 is configured to include the piezoelectric film 10, a case 42, a viscoelastic support 46, and a frame 48.

The case 42 is a thin housing which is formed of plastic or the like and has one opening surface. Examples of a shape of the housing include a rectangular parallelepiped shape, a cubic shape, and a cylindrical shape.

In addition, the frame 48 is a frame material which has, in the center thereof, a through-hole having the same shape as the opening surface of the case 42 and engages with the opening surface side of the case 42.

The viscoelastic support 46 is a support used for efficiently converting the stretching and contracting movement of the piezoelectric film 10 into a forward and rearward movement (a movement in the direction perpendicular to the surface of the film) by having moderate viscosity and elasticity, supporting the piezoelectric film 10, and applying a constant mechanical bias to any place of the piezoelectric film. Examples thereof include wool felt, nonwoven fabric such as wool felt containing PET, and glass wool.

The piezoelectric speaker 40 is configured by accommodating the viscoelastic support 46 in the case 42, covering the case 42 and the viscoelastic support 46 with the piezoelectric film 10, and fixing the frame 48 to the case 42 in a state of pressing a periphery of the piezoelectric film 10 against an upper end surface of the case 42 by the frame 48.

Here, in the piezoelectric speaker 40, the viscoelastic support 46 has a shape in which a height (thickness) thereof is larger than a height of an inner surface of the case 42.

Therefore, in the piezoelectric speaker 40, the viscoelastic support 46 is held in a state of being thinned by being pressed downward by the piezoelectric film 10 at the peripheral portion of the viscoelastic support 46. In addition, in the peripheral portion of the viscoelastic support 46, a curvature of the piezoelectric film 10 suddenly fluctuates, and a rising portion which decreases in height toward the periphery of the viscoelastic support 46 is formed in the piezoelectric film 10. Furthermore, a central region of the piezoelectric film 10 is pressed by the viscoelastic support 46 having a square columnar shape, and has a (approximately) planar shape.

In the piezoelectric speaker 40, in a case where the piezoelectric film 10 stretches in the in-plane direction due to the application of the driving voltage to the first electrode layer 16 and the second electrode layer 14, the rising portion of the piezoelectric film 10 changes an angle in a rising direction due to the action of the viscoelastic support 46 in order to absorb the stretched part. As a result, the piezoelectric film 10 having the planar portion moves upward.

On the contrary, in a case where the piezoelectric film 10 contracts in the in-plane direction due to the application of the driving voltage to the first electrode layer 16 and the second electrode layer 14, the rising portion of the piezoelectric film 10 changes an angle in a falling direction (a direction approaching the flat surface) in order to absorb the contracted part. As a result, the piezoelectric film 10 having the planar portion moves downward.

The piezoelectric speaker 40 generates a sound by the vibration of the piezoelectric film 10.

In the piezoelectric film 10 according to the embodiment of the present invention, the conversion from the stretching and contracting movement to the vibration can also be achieved by holding the piezoelectric film 10 in a bent state.

Therefore, the piezoelectric film 10 according to the embodiment of the present invention can function as a piezoelectric speaker having flexibility by being simply maintained in a bent state instead of the piezoelectric speaker 40 having rigidity in a flat plate shape, as shown in FIG. 7.

Such a piezoelectric speaker including the piezoelectric film 10 according to the embodiment of the present invention can be accommodated in a bag or the like by, for example, being rolled or folded using the favorable flexibility. Therefore, with the piezoelectric film 10 according to the embodiment of the present invention, a piezoelectric speaker which can be easily carried even in a case where the piezoelectric speaker has a certain size can be realized.

In addition, the piezoelectric film 10 according to the embodiment of the present invention has excellent elasticity and flexibility, and has no in-plane anisotropy as a piezoelectric characteristic. Therefore, in the piezoelectric film 10 according to the embodiment of the present invention, a change in acoustic quality is small regardless of the direction in which the film is bent, and a change in acoustic quality with respect to the change in curvature is also small. Accordingly, the piezoelectric speaker including the piezoelectric film 10 according to the embodiment of the present invention has a high degree of freedom of the installation place, and can be attached to various articles as described above. For example, a so-called wearable speaker can be realized by attaching the piezoelectric film 10 according to the embodiment of the present invention to clothes such as a suit and portable items such as a bag in a bent state.

Furthermore, the piezoelectric film according to the embodiment of the present invention can be used for a speaker of a display device by bonding the piezoelectric film to a display device having flexibility, such as an organic EL display device having flexibility and a liquid crystal display device having flexibility.

As described above, since the piezoelectric film 10 according to the embodiment of the present invention stretches and contracts in the plane direction in a case where a voltage is applied, and vibrates suitably in the thickness direction due to the stretch and contraction in the plane direction, a favorable acoustic characteristic of outputting a sound with a high sound pressure is exhibited, for example, in a case where the piezoelectric film is used for a piezoelectric speaker or the like.

The piezoelectric film 10 according to the embodiment of the present invention, which exhibits such a favorable acoustic characteristic, that is, exhibits high stretching and contracting performance due to piezoelectricity is satisfactorily operated as a piezoelectric vibrating element (exciter) which vibrates a vibrating body such as a vibration plate by laminating a plurality of the piezoelectric films. Since the piezoelectric film 10 according to the embodiment of the present invention has high durability, high durability is also exhibited in a case where the piezoelectric films are laminated to form a piezoelectric vibrator.

In a case of lamination of the piezoelectric films 10, each piezoelectric film may not have the second protective layer 18 and/or the first protective layer 20 unless there is a possibility of a short circuit. Alternatively, the piezoelectric films which do not have the second protective layer 18 and/or the first protective layer 20 may be laminated through an insulating layer.

As an example, a speaker in which a laminate of the piezoelectric films 10 is bonded to the vibration plate and the vibration plate is vibrated by the laminate of the piezoelectric films 10 to output a sound may be used. That is, in this case, the laminate of the piezoelectric films 10 acts as a so-called exciter which outputs a sound by vibrating the vibration plate.

By applying a driving voltage to the laminated piezoelectric films 10, each piezoelectric film 10 stretches and contracts in the plane direction, and the entire laminate of the piezoelectric films 10 stretches and contracts in the plane direction due to the stretch and contraction of each piezoelectric film 10. The vibration plate to which the laminate has been bonded is bent due to the stretch and contraction of the laminate of the piezoelectric films 10 in the plane direction, and as a result, the vibration plate vibrates in the thickness direction. The vibration plate generates a sound using the vibration in the thickness direction. The vibration plate vibrates according to the magnitude of the driving voltage applied to the piezoelectric film 10 and generates the sound according to the driving voltage applied to the piezoelectric film 10.

Therefore, the piezoelectric film 10 itself does not output a sound in this case.

Therefore, even in a case where the rigidity of each piezoelectric film 10 is low and the stretching and contracting force thereof is small, the rigidity is increased by laminating the piezoelectric films 10, and the stretching and contracting force as the entire laminate is increased. As a result, in the laminate of the piezoelectric films 10, even in a case where the vibration plate has a certain degree of rigidity, the vibration plate is sufficiently bent with a large force, and the vibration plate can be sufficiently vibrated in the thickness direction, so that the vibration plate can generate the sound.

In the laminate of the piezoelectric films 10, the number of laminated piezoelectric films 10 is not limited, and the number of sheets providing a sufficient amount of vibration may be appropriately set according to, for example, the rigidity of the vibration plate to be vibrated.

One piezoelectric film 10 according to the embodiment of the present invention can also be used as a similar exciter (piezoelectric vibrating element) in a case where one piezoelectric film has a sufficient stretching and contracting force.

The vibration plate vibrated by the laminate of the piezoelectric films 10 according to the embodiment of the present invention is not limited, and various sheet-like materials (such as plate-like materials and films) can be used.

Examples thereof include a resin film consisting of polyethylene terephthalate (PET) and the like, foamed plastic consisting of foamed polystyrene and the like, a paper material such as a corrugated cardboard material, a glass plate, and wood. Furthermore, a device such as a display device may be used as the vibration plate in a case where the device can be sufficiently bent.

It is preferable that the laminate of the piezoelectric films 10 is obtained by bonding adjacent piezoelectric films with a bonding layer (bonding agent). In addition, it is preferable that the laminate of the piezoelectric films 10 and the vibration plate are also bonded to each other with a bonding layer.

The bonding layer is not limited, and various layers which can bond materials to be bonded can be used. Therefore, the bonding layer may consist of a pressure sensitive adhesive or an adhesive. From the viewpoint that a solid and hard bonding layer is obtained after the bonding, it is preferable to use an adhesive layer consisting of an adhesive.

Regarding the above points, the same applies to a laminate formed by folding back a long piezoelectric film 10, which will be described later.

In the laminate of the piezoelectric films 10, the polarization direction of each piezoelectric film 10 to be laminated is not limited. As described above, the polarization direction of the piezoelectric film 10 according to the embodiment of the present invention is the polarization direction in the thickness direction.

Therefore, in the laminate of the piezoelectric films 10, the polarization directions may be the same for all the piezoelectric films 10, and piezoelectric films having different polarization directions may be present.

Here, in the laminate of the piezoelectric films 10, it is preferable that the piezoelectric films 10 are laminated such that the polarization directions of adjacent piezoelectric films 10 are opposite to each other.

In the piezoelectric film 10, the polarity of the voltage to be applied to the piezoelectric layer 12 depends on the polarization direction. Therefore, even in a case where the polarization direction is directed from the second electrode layer 14 toward the first electrode layer 16 or from the first electrode layer 16 toward the second electrode layer 14, the polarity of the second electrode layer 14 and the polarity of the first electrode layer 16 in all the piezoelectric films 10 to be laminated are set to be the same as each other.

Therefore, even in a case where the thin film electrodes of the adjacent piezoelectric films 10 come into contact with each other, since the thin film electrodes in contact with each other have the same polarity by reversing the polarization directions of the adjacent piezoelectric films 10, there is no risk of a short circuit.

The laminate of the piezoelectric films 10 may be configured such that a long piezoelectric film 10 is folded back, for example, once or more times, preferably a plurality of times, to laminate a plurality of layers of the piezoelectric film 10.

The configuration in which the long piezoelectric film 10 is folded back and laminated has the following advantages.

That is, in the laminate in which a plurality of cut sheet-like piezoelectric films 10 are laminated, it is necessary to connect the second electrode layer 14 and the first electrode layer 16 to a driving power supply for each piezoelectric film. On the contrary, in the configuration in which the long piezoelectric film 10 is folded back and laminated, only one sheet of the long piezoelectric film 10 can form the laminate. In addition, in the configuration in which the long piezoelectric film 10 is folded back and laminated, only one power source is required for applying the driving voltage, and the electrodes may be pulled out from the piezoelectric film 10 at one place.

Furthermore, in the configuration in which the long piezoelectric film 10 is folded back and laminated, polarization directions of adjacent piezoelectric films 10 are inevitably opposite to each other.

Hereinbefore, the piezoelectric film according to the embodiment of the present invention has been described in detail, but the present invention is not limited to the above-described examples and various improvements and changes can be made without departing from the spirit of the present invention.

EXAMPLES

Hereinafter, the present invention will be described in more detail with reference to specific examples of the present invention. The present invention is not limited to the examples, and the materials, the used amounts, the proportions, the treatment contents, the treatment procedures, and the like shown in the following examples can be appropriately changed within a range not departing from the scope of the present invention.

Example 1

Sheet-like materials 34 and 38 formed by sputtering a copper thin film having a thickness of 100 nm on a PET film having a thickness of 4 μm were prepared. That is, in the present example, the first electrode layer 16 and the second electrode layer 14 were copper thin films having a thickness of 100 nm, and the first protective layer 20 and the second protective layer 18 were PET films having a thickness of 4 μm.

In order to obtain favorable handleability during the process, a film with a separator (temporary support, PET) having a thickness of 50 μm was used as the PET film, and the separator of each protective layer was removed after the thermal compression bonding of the sheet-like material 38.

Meanwhile, cyanoethylated PVA (CR-V, manufactured by Shin-Etsu Chemical Co., Ltd.) was dissolved in methyl ethyl ketone (MEK) at the following compositional ratio. Thereafter, PZT particles were added to the solution at the following compositional ratio and dispersed using a propeller mixer (rotation speed of 2000 rpm), thereby preparing a coating material for forming the piezoelectric layer 12.

PZT Particles: 300 parts by mass
Cyanoethylated PVA: 15 parts by mass
MEK: 85 parts by mass Particles obtained by sintering commercially available PZT raw material powder at 1000° C. to 1200° C. and then crushing and classifying the sintered powder to have an average particle diameter of 5 μm were used as the PZT particles.

The first electrode layer 16 (copper thin film) of the sheet-like material 34 prepared in advance was coated with the coating material for forming the piezoelectric layer 12 prepared in advance using a slide coater. The coating material was applied so that a film thickness of the coating film after drying was 100 μm.

Next, a material obtained by coating the sheet-like material 34 with the coating material was heated and dried on a hot plate at 120° C. to evaporate MEK, thereby forming a laminate 36.

The produced piezoelectric layer was subjected to a calender treatment using a heating roller.

Next, the above-described laminate 36 was inserted between conductive plates installed in parallel at a distance of 1 mm, one of the conductive plates was connected to ground, a direct current voltage of 6 kV was applied to the other conductive plate, and an electrical polarization treatment was performed by generating an electric field between the conductive plates.

After the electrical polarization treatment, the sheet-like material 38 was laminated on the laminate 36 in a state where the second electrode layer 14 (copper thin film side) side was directed toward the piezoelectric layer 12, and subjected to thermal compression bonding at 70° C.

Next, a main surface of the laminate of the laminate 36 and the sheet-like material 38 on the second electrode layer 14 (sheet-like material 38) side was subjected to a heating treatment. The heating treatment was performed on a hot plate. The heating temperature was set to 100° C. and the heating time was set to 120 seconds.

As a result, the piezoelectric film 10 was produced.

Measurement of Domain Ratio

With the produced piezoelectric film, a crystal structure of the piezoelectric particles 26 in the piezoelectric layer 12 was measured by an X-ray diffraction method (XRD) using an X-ray diffractometer (X'Pert PRO manufactured by Malvern Panalytical Ltd., Cu radiation source, 45 kV, 40 mA). The sample was fixed on an adsorption sample table, and the measurement was performed by setting an incidence angle with respect to a sample surface to 0.5°.

Figure 9:
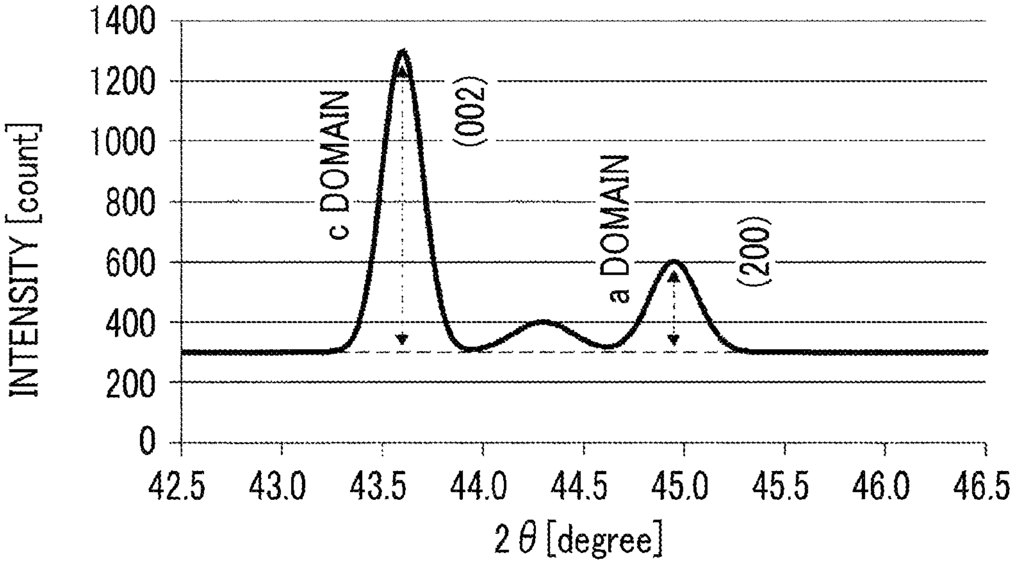
FIG. 9 is a graph showing a relationship between 2θ and an intensity obtained by measuring an XRD pattern.

In the obtained XRD pattern, first, intensities at 45.5° to 46.0° were averaged to determine an intensity B of a baseline (see FIG. 9). Next, a numerical value obtained by subtracting the B from the maximum intensity of the apex of the (002) plane peak in the vicinity of 43.5° was defined as the c domain. Next, a numerical value obtained by subtracting the B from the maximum intensity of the apex of the (200) plane peak in the vicinity of 45° was defined as the a domain, and a domain ratio=c domain/a domain was obtained.

The domain ratio was measured on both surfaces of the piezoelectric layer by the above-described measurement, and the ratio Z of the domain ratio X on one main surface side and the domain ratio Y on the other main surface side was calculated. The ratio Z was calculated at any five points, and the average value thereof was calculated.

The domain ratio X in the main surface on the first electrode layer 16 side was 4.34. The domain ratio Y in the main surface on the second electrode layer 14 side was 4.00. The ratio Z was 1.085. The average value of the domain ratios X and Y was 4.17.

Example 2

A piezoelectric film was produced in the same manner as in Example 1, except that the heating temperature of the heating treatment after the thermal compression bonding was changed to 110° C. and the heating time thereof was changed to 200 seconds.

Example 3

A piezoelectric film was produced in the same manner as in Example 1, except that the heating temperature of the heating treatment after the thermal compression bonding was changed to 120° C. and the heating time thereof was changed to 360 seconds.

Examples 4 to 6

Piezoelectric films were produced in the same manner as in Examples 1 to 3, except that the thickness of the piezoelectric layer was set to 50 μm.

Examples 7 to 9

Piezoelectric films were produced in the same manner as in Examples 1 to 3, except that the thickness of the piezoelectric layer was set to 10 μm.

Example 10

A piezoelectric film was produced in the same manner as in Example 5, except that the heating treatment after the thermal compression bonding was performed on the main surface on the first electrode layer side.

Example 11

A piezoelectric film was produced in the same manner as in Example 4, except that the heating temperature of the heating treatment after the thermal compression bonding was changed to 150° C. and the heating time thereof was changed to 600 seconds.

Comparative Examples 1 to 3

Piezoelectric films were each produced in the same manner as in Examples 1, 4, and 7, except that the heating treatment after the thermal compression bonding was not performed.

Evaluation

The piezoelectric speaker shown in FIG. 7 was produced using the produced piezoelectric film.

First, a rectangular test piece having a size of 210×300 mm (A4 size) was cut out from the produced piezoelectric film. The cut-out piezoelectric film was placed on a 210×300 mm case in which glass wool serving as a viscoelastic support was stored in advance as shown in FIG. 7, and the peripheral portion was pressed by a frame to impart an appropriate tension and an appropriate curvature to the piezoelectric film, thereby producing a piezoelectric speaker as shown in FIG. 7.

A depth of the case was set to 9 mm, a density of glass wool was set to 32 kg/m$^3$, and a thickness before assembly was set to 25 mm. In addition, all the piezoelectric speakers were produced by setting the lower electrode side of the piezoelectric film as the viscoelastic support side.

Figure 8:
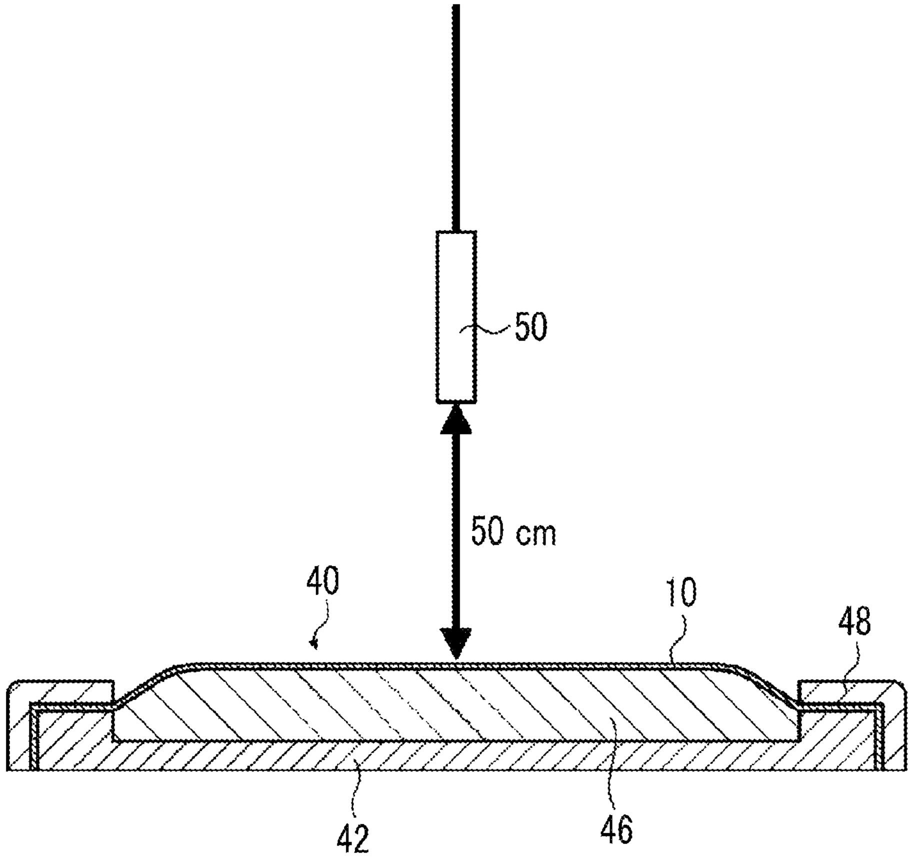
FIG. 8 is a conceptual view showing a measuring method of a sound pressure in Examples.

A 1 kHz sine wave was input to the produced piezoelectric speaker as an input signal through a power amplifier, and the sound pressure was measured with a microphone 50 placed at a distance of 50 cm from the center of the speaker as shown in FIG. 8. An input voltage was set to 20 Vrms in a case where the film thickness of the piezoelectric layer was 50 μm, and the input voltage was increased or decreased in proportion to the film thickness in the other film thicknesses for measurement.

The sound pressure was measured twice, 30 seconds after the start of the output from the piezoelectric speaker (initial) and 36 hours after the start of the output from the piezoelectric speaker (after the durability test). The initial sound pressure (initial), the sound pressure after the durability test (after the durability test), and the difference (deterioration) between the initial sound pressure and the sound pressure after the durability test are shown in Table 1.

The results are shown in Table 1.

TABLE 1

| | Piezoelectric layer | | | | | Sound pressure [dB] | | |
|---|---|---|---|---|---|---|---|---|
| | Film thickness [μm] | Domain ratio: First electrode layer side | Domain ratio: Second electrode layer side | Ratio Z | Average of domain ratios | Initial | After durability test | Deterioration |
| Example 1 | 100 | 4.34 | 4.00 | 1.085 | 4.17 | 83.2 | 67.3 | −15.9 |
| Example 2 | 100 | 4.20 | 2.95 | 1.424 | 3.58 | 73.3 | 67.1 | −6.2 |
| Example 3 | 100 | 3.98 | 2.23 | 1.785 | 3.11 | 65.3 | 61.8 | −3.5 |
| Example 4 | 50 | 4.21 | 4.00 | 1.053 | 4.11 | 82.3 | 63.7 | −18.6 |

TABLE 1-continued

| | Piezoelectric layer | | | | | Sound pressure [dB] | | |
|---|---|---|---|---|---|---|---|---|
| | Film thickness [μm] | Domain ratio: First electrode layer side | Domain ratio: Second electrode layer side | Ratio Z | Average of domain ratios | Initial | After durability test | Deterioration |
| Example 5 | 50 | 4.16 | 2.85 | 1.460 | 3.51 | 71.8 | 65.7 | −6.1 |
| Example 6 | 50 | 3.86 | 2.12 | 1.821 | 2.99 | 61.0 | 58.0 | −3.0 |
| Example 7 | 10 | 4.17 | 3.97 | 1.050 | 4.07 | 81.3 | 64.2 | −17.1 |
| Example 8 | 10 | 4.01 | 2.75 | 1.458 | 3.38 | 70.3 | 65.3 | −5.0 |
| Example 9 | 10 | 3.75 | 2.01 | 1.866 | 2.88 | 60.3 | 58.5 | −1.8 |
| Example 10 | 50 | 2.85 | 4.16 | 1.460 | 3.51 | 71.5 | 65.9 | −5.6 |
| Example 11 | 50 | 2.32 | 1.64 | 1.415 | 1.98 | 51.3 | 45.1 | −6.2 |
| Comparative Example 1 | 100 | 4.33 | 4.23 | 1.024 | 4.28 | 85.2 | 63.5 | −21.7 |
| Comparative Example 2 | 50 | 4.25 | 4.33 | 1.019 | 4.29 | 85.2 | 61.5 | −23.7 |
| Comparative Example 3 | 10 | 4.32 | 4.15 | 1.041 | 4.24 | 85.2 | 64.5 | −20.7 |

From Table 1, as compared with Comparative Examples, it was found that, in the piezoelectric film according to the embodiment of the present invention, the decrease in sound pressure between the initial sound pressure and the sound pressure after the durability test was small, and the durability was excellent.

In addition, from the comparison between Examples 1 and 2, Examples 4 and 5, and Examples 7 and 8, it was found that the ratio Z was preferably 1.09 or more.

In addition, from the comparison between Examples 2 and 3, Examples 5 and 6, and Examples 8 and 9, it was found that the ratio Z was preferably 1.86 or less.

In addition, from the comparison between Example 5 and Example 10, it was found that the same effect was obtained regardless of the surface of the piezoelectric layer subjected to the heating treatment.

In addition, from the comparison between Examples 4 to 6 and Example 11, it was found that the initial sound pressure was increased by setting the average value of the domain ratios to 2 or more, which is preferable.

From the above results, the effects of the present invention are clear.

The piezoelectric film according to the embodiment of the present invention is suitably used as the following, for example: as various sensors such as a sound wave sensor, an ultrasonic wave sensor, a pressure sensor, a tactile sensor, a strain sensor, and a vibration sensor (which are useful particularly for an infrastructure inspection such as crack detection and a manufacturing site inspection such as foreign matter contamination detection); acoustic devices such as microphones, pickups, speakers, and exciters (as specific applications, noise cancellers (used for cars, trains, airplanes, robots, and the like), artificial voice bands, buzzers to prevent pests and beasts from invading, furniture, wallpaper, photo, helmet, goggles, headrest, signage, robot, and the like are exemplified); haptics used for application to automobiles, smartphones, smart watches, games, and the like; ultrasonic transducers such as ultrasound probe and hydrophones; actuators used for prevention of attachment of water droplets, transportation, agitation, dispersion, polishing, and the like; damping materials (dampers) used for containers, vehicles, buildings, sports equipment such as skis and rackets; and vibration power generator used for application to roads, floors, mattresses, chairs, shoes, tires, wheels, computer keyboards, and the like.

EXPLANATION OF REFERENCES

10: piezoelectric film
12: piezoelectric layer
14: upper electrode layer
16: lower electrode layer
18: upper protective layer
20: lower protective layer
24: polymer matrix
26: piezoelectric particle
34, 38: sheet-like material
36: laminate
40: piezoelectric speaker
42: case
46: viscoelastic support
48: frame
50: microphone

What is claimed is:

1. A piezoelectric film comprising:

a piezoelectric layer consisting of a polymer-based piezoelectric composite material which contains piezoelectric particles in a matrix containing a polymer material; and electrode layers formed on both surfaces of the piezoelectric layer, wherein, in a case where a smaller value of a domain ratio X between a c domain and an a domain, which is measured by an X-ray diffraction method from one main surface side of the piezoelectric layer, or a domain ratio Y between a c domain and an a domain, which is measured by an X-ray diffraction method from the other main surface side of the piezoelectric layer, is set to 1.00, the other domain ratio is 1.05 or more.

2. The piezoelectric film according to claim 1, wherein an average value of the domain ratio X and the domain ratio Y is 2 or more.

* * * * *